United States Patent
Blackwell, Jr.

(10) Patent No.: US 8,294,099 B2
(45) Date of Patent: Oct. 23, 2012

(54) ON-WAFER BUTTED MICROBOLOMETER IMAGING ARRAY

(75) Inventor: Richard J. Blackwell, Jr., Dracut, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 358 days.

(21) Appl. No.: 12/757,247

(22) Filed: Apr. 9, 2010

(65) Prior Publication Data

US 2010/0258725 A1 Oct. 14, 2010

Related U.S. Application Data

(60) Provisional application No. 61/168,274, filed on Apr. 10, 2009.

(51) Int. Cl.
*G01J 5/00* (2006.01)
(52) U.S. Cl. ................... 250/332; 250/338.1
(58) Field of Classification Search ............. 250/332, 250/338.1
See application file for complete search history.

(56) References Cited

U.S. PATENT DOCUMENTS

| | | | |
|---|---|---|---|
| 5,554,849 A * | 9/1996 | Gates | 250/370.08 |
| 5,973,844 A | 10/1999 | Burger | |
| 6,124,974 A | 9/2000 | Burger | |
| 6,381,072 B1 | 4/2002 | Burger | |
| 6,479,827 B1 * | 11/2002 | Hamamoto et al. | 250/370.11 |
| 6,627,896 B1 * | 9/2003 | Hashimoto et al. | 250/370.11 |
| 6,897,855 B1 | 5/2005 | Matthies et al. | |
| 7,459,686 B2 | 12/2008 | Syllaios et al. | |
| 7,495,638 B2 | 2/2009 | Lamvik et al. | |
| 2005/0101867 A1 | 5/2005 | Johnson et al. | |
| 2007/0208254 A1 | 9/2007 | Johnson et al. | |
| 2009/0268983 A1 * | 10/2009 | Stone et al. | 382/284 |

* cited by examiner

*Primary Examiner* — Constantine Hannaher
(74) *Attorney, Agent, or Firm* — Maine Cernota & Rardin; David A. Rardin; Daniel J. Long

(57) ABSTRACT

An apparatus and method for assembling a large microbolometer infrared imaging array from sub-arrays, including the step of forming a sub-array assembly of independent imaging arrays on the silicon wafer as the imaging sensor is being processed, whereby seams or gaps in a resulting image are avoided.

20 Claims, 5 Drawing Sheets

100

| SIZE (µm) | FEATURE |
|---|---|
| 340 | BUFFER PIXELS |
| 0 | EDGE CIRCUITS |
| 0 | BOND PADS |
| 350 | GUARD RING, SEAL, SCRIBE |
| 25 | MINIMUM ASSEMBLY GAP |
| 100 | MAXIMUM ADDITIONAL ASSEMBLY TOLERANCE |
|  |  |
| 815 | TOTAL PER SIDE |
| 1630 | TOTAL GAP |

MECHANICALLY-BUTTED
ESTIMATED GAP BUDGET
FIG. 1

2 x 2 BUTTED ARRAYS

2048 X 1536 3 MPIXEL ARRAY

FLOW CHART

ON-WAFER BUTTED MICROBOLOMETER IMAGING ARRAY

RELATED APPLICATIONS

This application claims the benefit of U.S. Provisional Application Ser. No. 61/168,274 filed 10 Apr. 2009, herein incorporated in its entirety by reference.

FIELD OF THE INVENTION

The present invention relates to night vision devices and more particularly to microbolometer imaging arrays.

BACKGROUND OF THE INVENTION

The need for very large uncooled imaging systems has outpaced the development of large format focal plane arrays (FPAs). This need has motivated approaches to build very large uncooled imaging arrays using smaller arrays mechanically-butted together to form a larger imaging system. Smaller FPAs can be mechanically assembled in close proximity on a common carrier to form a larger imaging array.

Another approach to large format FPAs is reticle stitching. Reticle stitching is directed to producing larger FPAs by sub-dividing a circuitry pattern and then stitching, or recomposing the subfield patterns together using one or more reticles to form a large composite FPA. However, the manufacture of composite FPAs formed by stitching together the interconnections between subfields in accordance with conventional techniques is generally regarded as a problematic process that can provide unacceptably low yields and high costs. Further, the fabrication of sets of reticles which together define an integrated circuit structure constitutes a primary expenditure with regard to the fabrication of integrated circuits, and low reticle yields represent a significant loss of investment.

While buttable array imaging systems can achieve pixel counts that are multiples of the component FPAs with less development effort than a fully-scaled FPA with the same number of pixels, this approach places the burden of development on the chip assembly processes and on the system electronics and software that merge the sub-images. Full-scale large image ROIC and FPA with the same number of pixels require a complex and prolonged development program. Also, the system level performance for full-scale large arrays is only the same as for the component FPAs in a butted system.

A large mechanically-butted FPA imaging array will have some noticeable disadvantages. Notable issues will be in the image itself. There are seams between the component FPAs that result in "seams" in the image that need to be mitigated by image dithering and software. Significantly, in a 2×2 array these seams are in the center of the field of view. The imagery will also have different types of artifacts resulting from sub-sections of the image scanning independently of each other compared to the artifacts of a full array progressive scan. While the large mechanically-butted image array may be cost effective in low volume, the recurring cost of a fully scaled FPA will be lower in high volume production.

Mechanically-butted approaches to very large arrays can start with existing FPA technology, but layout modifications are needed to make an acceptable butted image. Existing FPAs do not lend themselves to being assembled without excessive gaps between the component pixel arrays that will result in seams in the image for which it is difficult to compensate. With no layout changes, the expected gap between imaging pixels is 2.5 mm plus assembly tolerances.

For mechanically-butted FPA imaging arrays, problem areas of the chip layout include the bond pads, circuitry along the array edges, process test strip and process overhead structures, buffer pixels at the pixel array edges, and the scribe streets. In a standard use, the bond pads are wire bonded to at least three sides of the FPA package. To be a component in a 2×2 butted array, the bond pads must be moved to provide two sides of the chip that are free of bond pads. Another layout issue for a mechanically-butted array is the circuitry along the pixel array edges. If these circuits are left in place, they add approximately 150 µm to the gap between imaging pixels in a mechanically-butted system.

FPAs include "extra" pixels that provide a process buffer at the edge of the pixel array where the pattern abruptly changes from dense pixels to no pixels. This significantly reduces defective pixels at the array edge, improving yield and edge of array image quality. For mechanically-butted systems, if these "extra" pixels are removed to reduce the gap size, there will be significant increases in bad pixels at the component array edges that will reduce yield and reduce image quality in the seam areas of the image.

Another difficult aspect of the FPA floor plan for mechanically-butted arrays is the scribe streets. The scribe streets contain ground busses, chip edge seals, and the actual scribe area to separate die. In all, this exceeds 350 µm on each side of the chip. These are difficult to remove for a mechanically-butted image array as they perform essential functions and the low precision of the dicing process requires a significant space to avoid yield loss from the dicing process, damaging active circuit areas.

Summarizing, a mechanically-butted imaging array is assembled from four FPAs on a common substrate. Both left handed and right handed versions of an optimized ROIC/FPA layout are required for good performance. The bond pads must be removed from the sides that will be butted. The gaps between the imaging pixels are driven by the features on the silicon outside of the live pixel arrays and the mechanical assembly precision.

FIG. 1 provides a table 100 of estimates for the size of gap resulting from each feature or tolerance. The buffer pixels remain for good process quality at the edge of the pixel array. The edge circuits are assumed to be relocated, but the guard ring, edge seal, and scribe lane remain. A minimum physical gap of 25 µm is listed with an additional 100 µm resulting from placement precision, exact scribe location, cleanliness of scribe edge, and parallelism of scribe edge to pixel array.

A need exists for an improved way to assemble a large microbolometer infrared imaging array from sub-arrays without seams or gaps in the resulting image. In particular, there is a need for an easier solution than is available by mechanically-butting sub-arrays on a common substrate or traditional integrated circuit stitching techniques.

BRIEF SUMMARY OF THE INVENTION

Smaller FPAs can be assembled "on the silicon" resulting in a larger imaging array on a single piece of silicon. According to the present invention, a sub-array assembly of independent imaging arrays is formed on the silicon wafer as the imaging sensor is being processed rather than by stitching a single large array or mechanically butt assembling the sub arrays after they are fabricated. Embodiments include a 2×2 array of FPAs resulting in an imaging system with four times the pixels of the individual FPAs. Particular embodiments include a 1024×768, 17 micron (μm), FPA. Embodiments apply to families of FPAs of that share similar chip floor plans.

Embodiments provide an on-wafer method for assembling a large microbolometer infrared imaging array from sub-arrays comprising the steps of providing a wafer; and forming a super-array assembly of independent imaging arrays on the wafer as the imaging sensor is being processed without stitching or mechanically-butting, whereby seams or gaps in a resulting image are avoided. For more embodiments, the step of forming a sub-array assembly of independent imaging arrays comprises producing a gap dimension between arrays less than about approximately 2.5 mm; less than one pixel; and limited only by photolithographic capabilities to a fraction of a pixel. In other embodiments, the step of forming a sub-array assembly of independent imaging arrays comprises four 1024×768, 17 micron (μm), focal plane arrays (FPAs). In yet other embodiments, the aperture of the large microbolometer infrared imaging array is about approximately 44.5 mm. For further embodiments, the step of forming a sub-array assembly of independent imaging arrays comprises forming left and right handed focal plane arrays (FPAs); and the step of forming a sub-array assembly of independent imaging arrays comprises forming mirror-image focal plane arrays (FPAs). Another embodiment includes the step of modifying a base read out integrated circuit (ROIC) from a 1024×768 format to a 2048×1536 format. For yet further embodiments, the large microbolometer infrared imaging array comprises 12 Mpixels; the FPAs operate at 30 Hz; and die size of the large microbolometer infrared imaging array is about approximately 40 mm by 40 mm. In other embodiments, the step of forming a sub-array assembly of independent imaging arrays comprises eliminating buffer pixels. In embodiments, the large microbolometer infrared imaging array is used for surveillance.

Further embodiments provide a method of on-wafer forming a large microbolometer infrared imaging array comprising modifying edge design of a plurality of focal plane arrays (FPAs); modifying at least one FPA with mirroring; modifying at least one FPA for left and right-handed versions; providing reticles; and forming an array from a plurality of the modified FPA subarrays on the wafer, whereby gaps in a resulting image are avoided. Additional embodiments further include the step of eliminating buffer pixels. Yet further embodiments further comprise the step of moving alignment marks and metrology structures from the top and left sides of at least one FPA. In embodiments, the large microbolometer infrared imaging array comprises a night vision system; and a thermal weapon sight.

Another embodiment provides an on-wafer assembled large microbolometer infrared imaging array device fabricated comprising the steps of providing a wafer; and forming a sub-array assembly of independent imaging arrays on the wafer as the imaging sensor is being processed, whereby seams or gaps in a resulting image are avoided.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention is further described with reference to the accompanying drawings wherein:

FIG. 1 is a table showing estimated gap budget for mechanically assembled 2×2 butted arrays;

DETAILED DESCRIPTION OF THE INVENTION

An advantage of on-wafer buttable array imaging systems is that they achieve higher effective frame rates than a fully-scaled imaging array. In on-wafer buttable system embodiments, each component FPA runs at the frame rate typical of that size array. Additionally, the on-wafer buttable approach avoids the difficult very large scaled FPA ROIC design required to maintain the frame rate of very large scaled FPAs as the number of pixels is increased.

Figure 2:
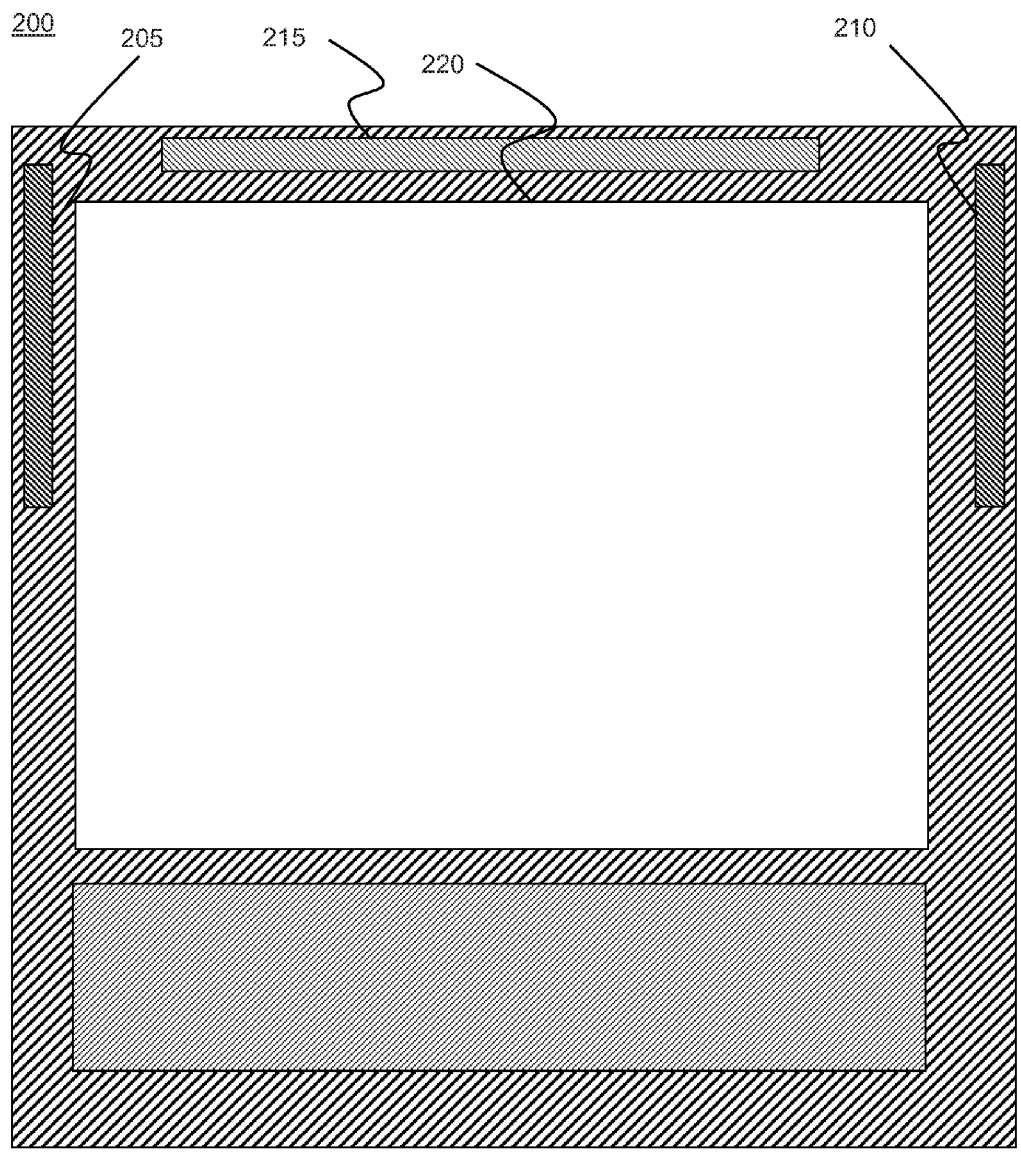
FIG. 2 is an individual 1024×768 array floor plan configured in accordance with the present invention.

The ROIC/FPA modifications require only layout changes rather than actual circuit changes and are low risk projects. The types of layout changes needed for buttable FPAs are evident from the floor plan plot 200 in FIG. 2.

The strips along each of the left 205, right 210, and top 215 edges of the chip are the bond pad areas. For embodiments, the top and left sides are devoid of bond pads and provide for on-wafer seamless butting. In embodiments, a modest amount of circuitry along the top and left side of the pixel array is relocated or tolerated as part of the seam in the image. These circuits can be moved with minimal risk.

Along the top of the ROIC/FPA is a section of process test structures and some of the process metrology structures. In some embodiments, the test structure strip is moved to the bottom of the chip with little risk. For embodiments, the process overhead structures (alignment marks and metrology structures) are moved from the top and left sides with modest risk and process development.

As stated, FPAs contain buffer pixels at the edge of the pixel array to improve the process uniformity for the live pixels. These pixels are those outside the white box 220 in the pixel array area of FIG. 2. These pixels can be removed to reduce or eliminate the gap between pixel arrays.

Figure 3:
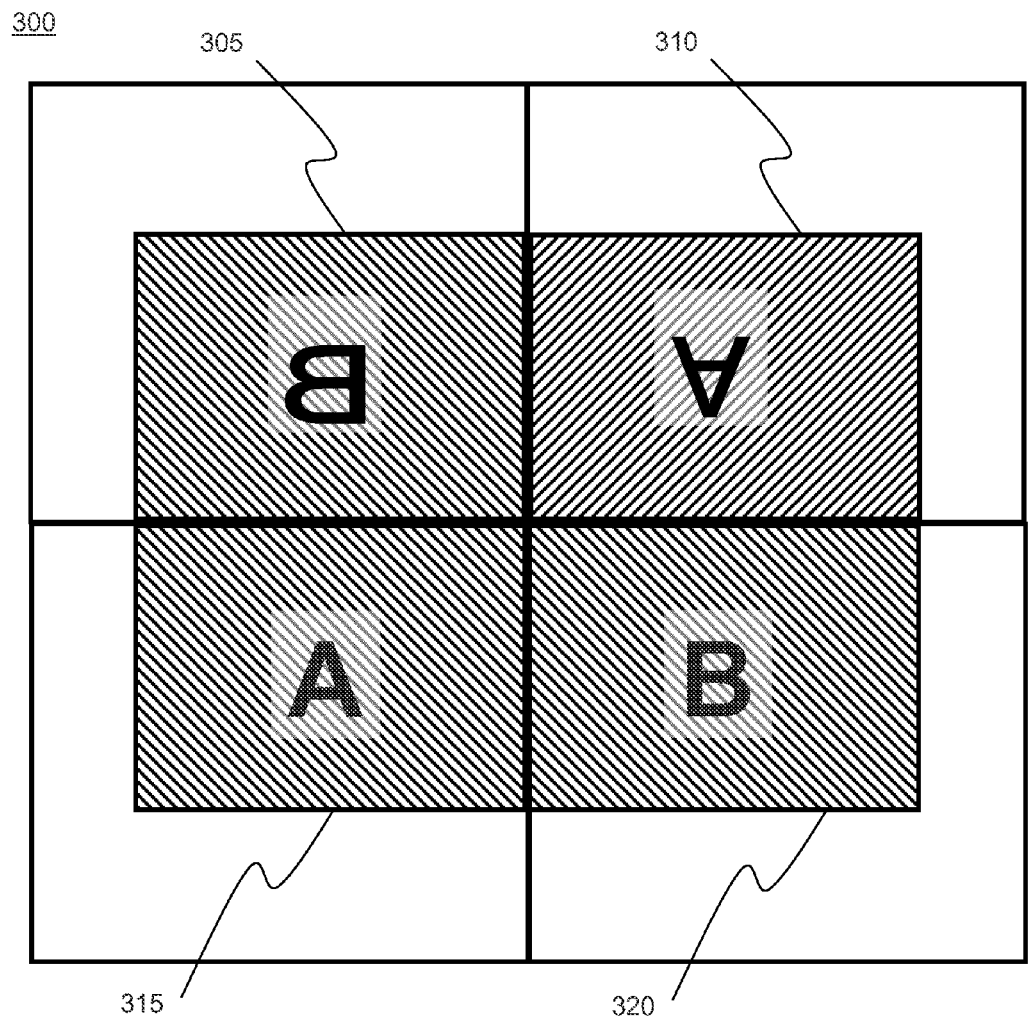
FIG. 3 is a schematic drawing showing 2×2 butted arrays left (A) and right (B) handed FPAs.

FIG. 3 depicts the layout 300 consideration that a 2×2 butted array employs "left" and "right" handed versions of the FPA. Embodiments of the 2×2 butted array include a modified layout that is optimal for butting on two adjacent sides. The 2×2 array also includes a mirror image layout. The mirroring process is straight forward once the two adjacent sided layout is complete, noting to not mirror the process overhead or process test structures.

An imaging array butted "on the silicon" can provide superior image quality by providing a large array of pixels with no dead space between pixel sub-arrays. By placing four sub-arrays 305, 310, 315 and 320 as in FIG. 3 adjacent on a wafer, the image seams can be eliminated and the four sub-arrays can be aligned with lithographic precision rather than mechanical assembly precision. The end result is a very high quality, high frame rate imaging system with four times the pixels but minimal ROIC/FPA design risk.

In embodiments, the ROIC/FPA layout for an imaging system built on the wafer is much more aggressive than for a mechanically-butted imaging system. The between chip gap "budget" in FIG. 1 can be reduced to 0. The buffer pixels on butting sides can be eliminated. This is because when the arrays are placed adjacent on the wafer, the adjacent pixels provide a uniform process zone. The guard ring and scribe seal layout is done for the integrated chip level so they do not contribute to the image seam. Finally, the butted arrays are placed on the wafer with lithographic precision (less than 1 micron) so the physical assembly gaps and tolerances are zero. The end result is a continuous large pixel array that electronically consists of four independent circuits.

Figure 4:
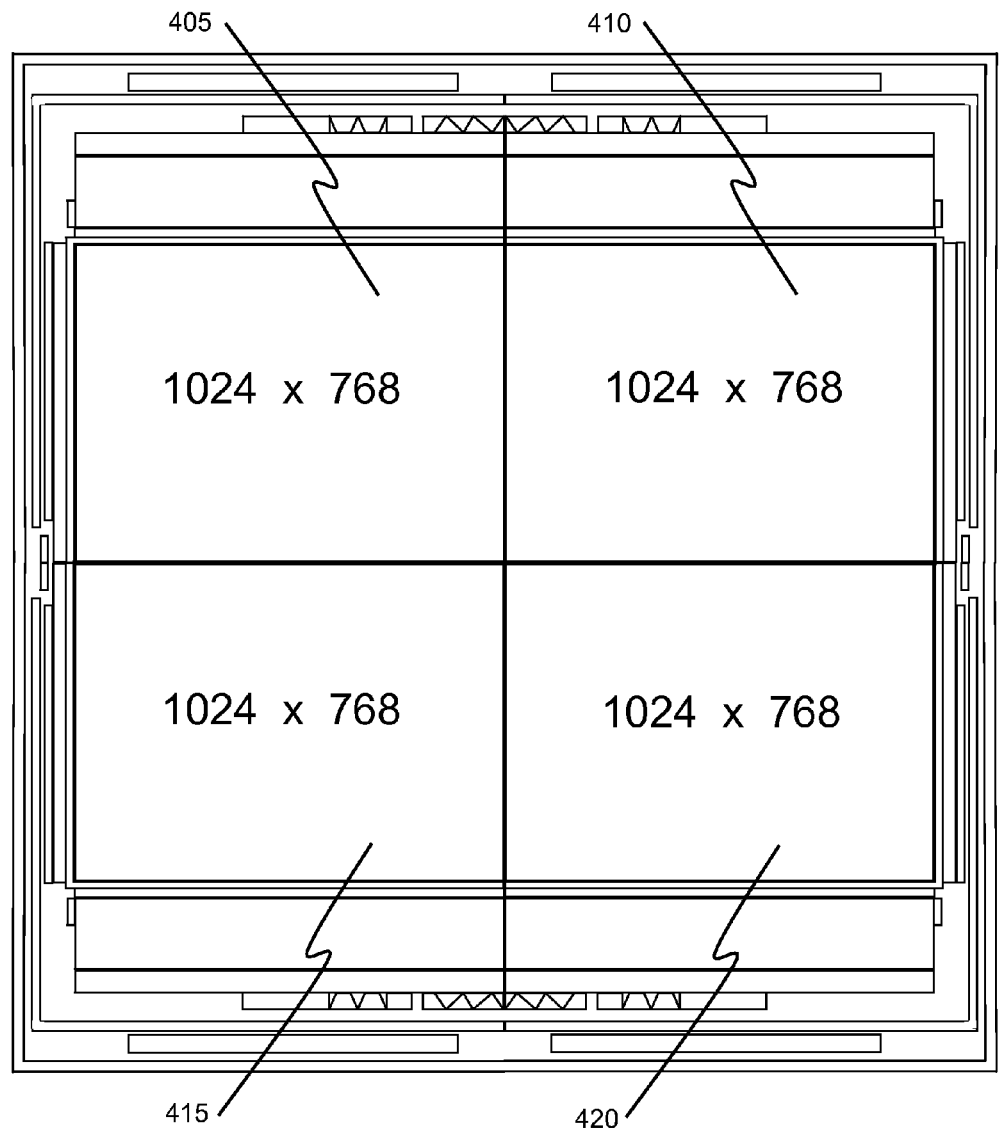
FIG. 4 is a 2048×1536 floor plan for a 3 Mpixel array configured in accordance with the present invention.

FIG. 4 shows a floor plan 400 of an effective 2048×1536 array embodiment of four FPAs 405, 410, 415, and 420 assembled on-wafer. The effective die size is around 40 mm. In embodiments, the frame rate of the system is 30 Hz, the same as the individual sub-arrays.

The on-wafer butted array built on a wafer is not a "stitching" approach since the four sub-chips that form the larger array are physically and electrically independent. A stitched chip is a single electrical element and requires more complex processing than an assembled "on the silicon" approach.

In a good imaging array, all four sub-arrays function and have acceptable operability. The image quality and system simplicity resulting from the large, continuous array of pixels is traded for the ability to pick good die for mechanical assembly.

Figure 5:
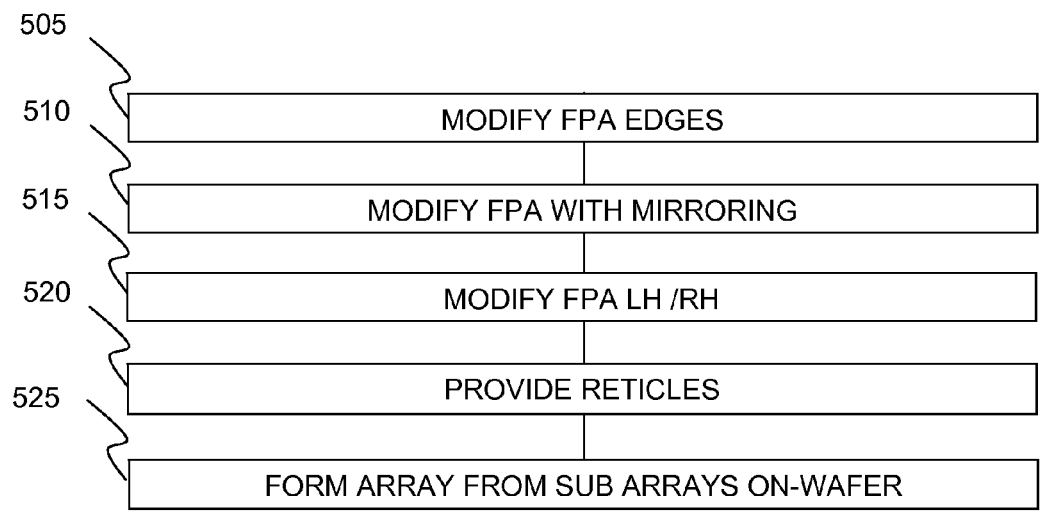
FIG. 5 is a flow chart of a method configured in accordance with the present invention.

FIG. 5 depicts a flow chart 500 of the steps of a method to produce an on-wafer device. Steps include modify FPA edges 505, modify FPA with mirroring 510, modify FPA for left and right-handed versions 515, provide reticles 520, and form array from sub arrays on-wafer 525.

The same method producing an on-wafer butted 3 Mpixel imaging array can be extended to produce a 12 Mpixel array. The base ROIC is modified from a 1024×768, 30 Hz format to a 2048×1536, 15 Hz format. Within the ROIC architecture, the number of columns can be increased with no decrease in frame rate, only an increase in I/O channels. The number of rows can be increased, and the frame rate can be reduced to maintain pixel sensitivity. For very large arrays used in surveillance applications, a lower frame rate can be acceptable. In this case, embodiments increase the number of rows from 768 to 1536 and reduce the frame rate from 30 Hz to 15 Hz. Then, using the 2×2 on-wafer buttable methods described above and reasonable extensions to the ROIC/FPA design, imaging systems with 4096×3072, 12 Mpixel format with a 15 Hz frame rate result.

Summary Trades

|  | Mechanically-Butted | Assembled on Silicon |
| --- | --- | --- |
| Format | 2 × 2 1024 × 768 | 2 × 2 1024 × 768 |
| Effective Pixels | 2948 × 1536 (3M) | 2948 × 1536 (3M) |
| Aperture Size | 47.7 mm | 44.5 mm |
| Layouts Required | 2 | 4 |
|  | (Left and Right Version of base layout) | (UR, UL, LR, LL version of base layout) |
| Reticle Sets Required | 2 | 4 |
| ROIC Risk | Low | Low |
| Seam size | ~1.6 mm | 0 mm |
| Approximate Die Size | 21 mm × 21 mm | 40 mm × 40 mm |
| Frame Rate | 30 Hz | 30 Hz |
| Process Difficulty | Medium | Medium/High (die size) |
| Wafer Level Yield | Good | Medium |
| Assembly Difficulty | Very High (placement tolerances) | Medium/High (die size) |
| System Difficulty | Very High (seam removal, placement artifact removal, sync 4 FPAs and data volume) | High (sync 4 FPAs and data volume) |
| Image Quality | Depends on seam removal and die placement accuracy | Excellent |

Those skilled in the art will appreciate that the method and device of this invention places sub-arrays adjacent to each other on a silicon wafer to provide a butted array with little or no gap between sections of the integrated image. The new method requires only minor modifications to existing, proven, imaging sensor designs to allow the imaging pixels to be placed adjacent on the wafer resulting in an imaging sensor where the "gap" between sub-arrays is limited only by photolithographic capabilities to a very small faction of a pixel. This is a much better imaging solution than mechanically assembling the sensors on a common carrier and much simpler solution for 1×2 and 2×2 arrays than a full stitched design.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An on-wafer method for assembling a large microbolometer infrared imaging array from sub-arrays comprising the steps of:
    providing a wafer; and
    forming a super-array assembly of independent imaging arrays on said wafer as the imaging sensor is being processed without stitching or mechanically-butting, whereby seams or gaps in a resulting image are avoided;
    said forming including modifying edge design of a plurality of focal plane arrays (FPAs);
    modifying at least one FPA with mirroring;
    modifying at least one FPA for left and right-handed versions;
    providing reticles; and
    forming an array from a plurality of said modified FPA subarrays on said wafer, whereby gaps in a resulting image are avoided.

2. The method of claim 1, wherein said step of forming a super-array assembly of independent imaging arrays comprises producing a gap dimension between arrays less than about approximately 2.5 mm.

3. The method of claim 1, wherein said step of forming a super-array assembly of independent imaging arrays comprises producing a gap dimension between arrays less than one pixel.

4. The method of claim 1, wherein said step of forming a super-array assembly of independent imaging arrays comprises producing a gap dimension between arrays limited only by photolithographic capabilities to a fraction of a pixel.

5. The method of claim 1, wherein said step of forming a super-array assembly of independent imaging arrays comprises four 1024×768, 17 micron (μm), focal plane arrays (FPAs).

6. The method of claim 5, wherein aperture of said large microbolometer infrared imaging array is about approximately 44.5 mm.

7. The method of claim 5, wherein said FPAs operate at 30 Hz.

8. The method of claim 1, wherein said step of forming a super-array assembly of independent imaging arrays comprises forming left and right handed focal plane arrays (FPAs).

9. The method of claim 1, wherein said step of forming a super-array assembly of independent imaging arrays comprises forming mirror-image focal plane arrays (FPAs).

10. The method of claim 1, further comprising the step of:
modifying a base read out integrated circuit (ROIC) from a 1024×768 format to a 2048×1536 format.

11. The method of claim 10, wherein said large microbolometer infrared imaging array comprises 12 Mpixels.

12. The method of claim 1, wherein die size of said large microbolometer infrared imaging array is about approximately 40 mm by 40 mm.

13. The method of claim 1, wherein said step of forming a super-array assembly of independent imaging arrays comprises eliminating buffer pixels.

14. The method of claim 1, wherein said large microbolometer infrared imaging array is used for surveillance.

15. A method of on-wafer forming a large microbolometer infrared imaging array comprising:
modifying edge design of a plurality of focal plane arrays (FPAs);
modifying at least one FPA with mirroring;
modifying at least one FPA for left and right-handed versions;
providing reticles; and
forming an array from a plurality of said modified FPA subarrays on said wafer, whereby gaps in a resulting image are avoided.

16. The method of claim 15, further comprising the step of eliminating buffer pixels.

17. The method of claim 15, further comprising the step of moving alignment marks and metrology structures from the top and left sides of at least one FPA.

18. The method of claim 15, wherein said large microbolometer infrared imaging array comprises a night vision system.

19. The method of claim 15, wherein said large microbolometer infrared imaging array comprises a thermal weapon sight.

20. An on-wafer assembled large microbolometer infrared imaging array device fabricated comprising the steps of:
providing a wafer; and
forming a sub-array assembly of independent imaging arrays on said wafer as the imaging sensor is being processed, whereby seams or gaps in a resulting image are avoided;
said forming including modifying edge design of a plurality of focal plane arrays (FPAs);
modifying at least one FPA with mirroring;
modifying at least one FPA for left and right-handed versions;
providing reticles; and
forming an array from a plurality of said modified FPA subarrays on said wafer, whereby gaps in a resulting image are avoided.

* * * * *